United States Patent
DeKraker

(10) Patent No.: US 9,412,628 B2
(45) Date of Patent: Aug. 9, 2016

(54) ACID TREATMENT STRATEGIES USEFUL TO FABRICATE MICROELECTRONIC DEVICES AND PRECURSORS THEREOF

(75) Inventor: David P. DeKraker, Burnsville, MN (US)

(73) Assignee: TEL FSI, INC., Chaska, MN (US)

(*) Notice: Subject to any disclaimer, the term of this patent is extended or adjusted under 35 U.S.C. 154(b) by 274 days.

(21) Appl. No.: 13/493,073

(22) Filed: Jun. 11, 2012

(65) Prior Publication Data

US 2013/0000682 A1    Jan. 3, 2013

Related U.S. Application Data

(60) Provisional application No. 61/503,233, filed on Jun. 30, 2011.

(51) Int. Cl.
  *H01L 21/67* (2006.01)
  *H01L 21/02* (2006.01)

(52) U.S. Cl.
  CPC .... *H01L 21/67051* (2013.01); *H01L 21/02052* (2013.01); *H01L 21/02057* (2013.01)

(58) Field of Classification Search
  None
  See application file for complete search history.

(56) References Cited

U.S. PATENT DOCUMENTS

| | | | |
|---|---|---|---|
| 5,810,940 A * | 9/1998 | Fukazawa et al. | 134/3 |
| 6,361,407 B1 | 3/2002 | Lu et al. | |
| 6,513,537 B1 * | 2/2003 | Orii et al. | 134/1.2 |
| 7,482,282 B2 | 1/2009 | Hilscher et al. | |
| 7,718,009 B2 * | 5/2010 | Verhaverbeke et al. | 134/3 |
| 2004/0035448 A1 * | 2/2004 | Aegerter et al. | 134/33 |
| 2006/0014656 A1 * | 1/2006 | Egbe et al. | 510/175 |
| 2007/0227556 A1 * | 10/2007 | Bergman | 134/3 |
| 2009/0281016 A1 * | 11/2009 | Cooper et al. | 510/176 |
| 2010/0018951 A1 | 1/2010 | Christenson et al. | |

* cited by examiner

*Primary Examiner* — Nicole Blan
(74) *Attorney, Agent, or Firm* — Kagan Binder, PLLC

(57) ABSTRACT

A method of treating one or more wafers is provided. The method comprises the steps of:
  a) providing at least one wafer, that has first and second opposed major faces and at least one feature, such as a metal silicide, that is sensitive to a neutralizing chemistry on the first major face;
  b) causing an acidic chemistry, such as a sulfuric acid and/or phosphoric acid, to contact the first major face of the wafer and causing the wafer to spin;
  c) after causing the acidic chemistry to contact the wafer, causing a non-etching rinsing fluid to contact the first major face while the wafer is spinning; and
  d) during at least a portion of the time that the non-etching rinsing fluid is caused to contact the first major face of the spinning wafer, causing a neutralizing liquid to contact the second major face of the spinning wafer.

15 Claims, No Drawings

ACID TREATMENT STRATEGIES USEFUL TO FABRICATE MICROELECTRONIC DEVICES AND PRECURSORS THEREOF

PRIORITY CLAIM

This application claims the benefit of U.S. Provisional Application Ser. No. 61/503,233, filed Jun. 30, 2011, entitled ACID TREATMENT STRATEGIES USEFUL TO FABRICATE MICROELECTRONIC DEVICES AND PRECURSORS THEREOF, the disclosure of which is incorporated herein by reference in its entirety for all purposes.

FIELD OF THE INVENTION

The present invention relates to methods for processing one or more microelectronic workpieces in a process chamber according to recipes that involve acid chemistries. More particularly, the present invention relates to such methods in which one or more acid treatment steps are followed up by a treatment that involves dispensing non-etching rinsing liquid onto a first major surface of the microelectronic workpiece while a neutralizing chemistry is dispensed onto a different surface included in the process chamber which preferably may be a second major surface (e.g. back side) of the workpiece.

BACKGROUND

The manufacture of microelectronic devices may involve processing in-process precursors (also referred to as workpieces herein) of these devices with an acid chemistry. Acid chemistries may be used for a variety of purposes. An exemplary use involves removing photoresist or photoresist residues from the workpieces.

A variety of acid chemistries are known. Exemplary acid chemistries include aqueous phosphoric acid, aqueous mixtures including phosphoric acid and sulfuric acid, aqueous sulfuric acid, aqueous mixtures including sulfuric acid and an oxidizing agent such as a peroxide or ozone; nitric acid; combinations of these, and the like. Mixtures of sulfuric acid and hydrogen peroxide are known as SPM chemistry or, alternatively, piranha chemistry.

After acid treatment, it is desirable to rinse workpiece surfaces thoroughly to remove the acid chemistry and/or acid by-products such as salts thereof. Residual acid or salts of acids left on a workpiece surface can cause particle contamination, haze, yield losses, etc.

One way to assess whether workpieces have been rinsed sufficiently following an acid treatment involves assessing whether workpieces develop a haze after sitting for a period of time, e.g., 1 to 24 hours, following the treatment regime. Development of a haze on the workpiece surface generally indicates that the acid chemistry and by-products thereof, such as salts, have not been effectively rinsed from the workpiece surface. Haze may be detected using a laser-based, light scattering detection instrument. Such an instrument scans the surface being evaluated. Light is scattered by particles on the surface. Scattered light is counted and corresponds to the number of particles on the surface. High particle counts, e.g., particle counts of about 400 or higher with a measurement sensitivity of 45 nm and larger, indicate haze. In many cases, it is unacceptable to practice a treatment that allows such a haze to develop. An absence of a haze after sitting for such a time period indicates that the workpiece has been treated, cleaned, and rinsed effectively. Haze assessment is useful to assess rinsing performance.

One strategy to remove acid involves rinsing workpieces with water. When using water alone for rinsing, substantial volumes of water may be needed to effectively rinse the workpiece surfaces. This not only uses a substantial amount of water, but rinsing merely with water alone can take too long to achieve desired throughput in some applications.

Treatments that use less rinsing fluid and/or that accomplish rinsing faster generally involve neutralizing and removing the acid and salts thereof using a suitable neutralizing chemistry often in combination with one or more water rinses.

For example, aqueous mixtures including ammonia and/or another alkaline reagent have been used to neutralize and remove acids and acid salts from workpiece surfaces. One example of aqueous ammonia chemistry is generally referred to as the SC1 chemistry. This chemistry is prepared by combining ingredients including aqueous ammonia (generally in the form $NH_4OH$ in aqueous solution), aqueous hydrogen peroxide, and water. A typical SC1 formulation includes one part by volume aqueous ammonium hydroxide (29% by weight ammonium hydroxide), 4 parts by volume hydrogen peroxide (30% by weight peroxide), and 70 parts by volume water. Other formulations that are more concentrated or more dilute with respect to ammonium hydroxide and/or peroxide also have been used.

The SC1 chemistry often is used in combination with water rinse(s). An integrated treatment to remove resist on the front side of a workpiece therefore might involve a treatment sequence in which the front side of the workpiece is treated with an SPM reagent. This is followed by rinsing the front side with water. Then, the front side of the workpiece is treated with an SC1 reagent. This is followed by rinsing the front side with water again. The workpiece is then dried. Some conventional processes treat the workpiece surface with aqueous peroxide or other oxidizing reagent in order to make the rinsing/neutralizing more effective.

Unfortunately, many materials are sensitive to and can be damaged by acid neutralizing chemistries such as the SC1 chemistries. Exemplary materials that are sensitive to SC1 chemistries and ammonia chemistries in general include metal silicides, particularly metal silicides incorporating nickel and platinum. Other ammonia-sensitive materials include oxides, nitrides, silicon, metals, combinations of these, and the like.

Thoroughly rinsing the front side of the workpiece with water has been used as one alternative to remove acid and acid by-products. On the one hand, thoroughly rinsing the workpiece front side with water initially appears to rinse the surface quite effectively. On the other hand, it has been observed that a haze may still develop on the surface anyway.

Therefore, there is a strong need for treatment strategies that reduce haze without unduly damaging sensitive features.

SUMMARY OF THE INVENTION

The present invention provides treatment strategies that reduce haze without unduly damaging sensitive microelectronic features or precursors thereof. These strategies involve a combination of neutralizing and rinsing strategies that quickly and effectively remove residual acid and acid by-products from both the front side of workpiece(s) as well as from other processing chamber surfaces that can be causes of haze. In the practice of the present invention, the front side of the workpiece also is referred to as the first major surface, and the back side of the workpiece is referred to as the second major surface.

In one aspect, the present invention is based at least in part upon the appreciation that haze can result not only from residual material left on the front side of the workpiece itself, but also from residual acid and acid by-product material on the surrounding chamber walls. Accordingly, rinsing strategies are used to thoroughly rinse the wafer front side in a manner effective to avoid unduly damaging sensitive features, while neutralizing chemistries are used to rinse at least a portion of the other surfaces in the processing chamber. The front side is easy to rinse thoroughly using a safe rinsing liquid such as water, but it can take too much time to also rinse chamber walls with just water. Using neutralizing chemistries on these other chamber surfaces is fast and effective without undue exposure of sensitive microelectronic features or precursors thereof to the neutralizing chemistry. Preferred embodiments provide wafer surfaces with no discernible haze to demonstrate the effectiveness of the treatment strategies.

For example, one aspect of the present invention is based at least in part on a strategy in which an acid treatment is performed in a process chamber on a microelectronic workpiece whose top surface incorporates one or more features or precursors thereof that are sensitive to neutralizing chemistries such as solutions comprising aqueous ammonia or the like. The acid treatment is followed by applying a non-etching rinsing fluid, such as deionized water, onto the front side of the workpiece, preferably while the workpiece spins. Additionally, a neutralizing chemistry is applied to at least one other surface in the process chamber other than the front side of the workpiece. Desirably, such other surface is substantially at or below the plane of the workpiece. Preferably, such other surface is the back side of the spinning wafer. The neutralizing chemistry is introduced during at least a portion of the time that the non-etching rinsing fluid is applied to the top surface.

According to a non-etching test protocol suitable in the practice of the present invention, the term "non-etching" with respect to a particular rinsing fluid means that the fluid etches less than about 0.5 angstroms, preferably less than about 0.3 angstroms, more preferably less than about 0.1 angstroms of at least the exposed dielectric, conductive and semiconductive regions on the surface being rinsed on a wafer substrate spinning at 200 rpm when 1 liter/min of the rinsing fluid are dispensed at 25° C. onto the center of the spinning workpiece for a period of 30 seconds. Examples of rinsing fluids that meet these criteria for a wide range of conductive and semiconductive materials include water, alcohol, ultra-dilute aqueous ammonium hydroxide (e.g., aqueous ammonia containing 100 ppm (on a weight basis) or less ammonium hydroxide), combinations of these, and/or the like. Even SC1 chemistries, piranha chemistries, dilute HF chemistries, or the like, can be non-etching for purposes of the present invention if sufficiently dilute. A liquid is "etching" with respect to the material if more of the material(s) are etched by the fluid according to this protocol.

Surprisingly, hazing is substantially avoided even though only a non-etching rinsing fluid contacts the front side of the workpiece. Further, it is counterintuitive that a neutralizing chemistry applied to the back side of a wafer could alleviate haze so dramatically on the opposite, top face of the workpiece.

Without wishing to be bound, a possible theory to explain the performance of the present invention can be suggested. It is believed that significant sources of acid and acid by-products include not only the top of the wafer(s) being processed but also other surfaces inside the process chamber including walls, wafer back side, dispensing hardware, etc. It is believed that these surfaces get coated with the acid materials during acid processing as the acidic treatment chemistry is flung off the spinning wafer. Some of these acidic materials can vaporize and then condense on the top of the wafer(s) to lead to undue haze, contamination, yield losses, etc. Dispensing neutralizing chemistry onto the back side of the spinning wafer, in combination with dispensing inert rinsing fluid onto the front side of the wafer, effectively neutralizes and rinses off the various surfaces inside the process chamber on, above, and below the wafer(s).

For instance, as the neutralizing chemistry is dispensed onto the back side, the spinning action of the wafer(s) cause the neutralizing chemistry to sheet outward and rinse the back side surface of the wafer(s). The neutralizing chemistry is then slung off the wafer(s) to rinse chamber walls and hardware at or below the level of the wafer back side. In the meantime, the inert rinsing fluid effectively rinses acid materials from surfaces on top of and above the wafer, transporting the acid materials to the lower chamber surfaces where the neutralizing chemistry does its work. The sheeting and transport action of the inert rinsing fluid also protects the front side of the wafer against contact with back side neutralizing chemistry.

Very thorough rinsing and neutralizing action is achieved by this cooperation between the inert rinsing liquid and the neutralizing chemistry. Overall, this dramatically inhibits the vaporization/condensation mechanism to allow very thorough acid neutralization and rinsing while minimizing risk that the neutralizing chemistry might unduly damage features on top of the wafer(s). The wafer(s) are effectively processed and the haze sources are substantially negated.

The treatment strategies are readily incorporated into tools that are commercially available or that might already be an existing resource in the facility of the user. Preferably, the strategies are used in single wafer processing systems. An exemplary tool in which these strategies may be used is the versatile single wafer processing tool available under the trade designation ORION® from FSI International, Inc., Chaska, Minn.

In one aspect, the present invention relates to a method of treating one or more wafers. At least one wafer is provided that includes first and second opposed major faces. At least one feature sensitive to a neutralizing chemistry is included on the first major face. An acidic chemistry is caused to contact the first major face of the wafer. After the acidic treatment, an inert rinsing fluid is caused to contact the first major face while the wafer is spinning. During at least a portion of the time that the inert rinsing fluid is caused to contact the first major face of the spinning wafer, a neutralizing liquid is caused to contact the second major face of the spinning wafer. Desirably, direct contact between the first major face and the neutralizing liquid is substantially avoided to help minimize exposure of the at least one sensitive feature to the neutralizing chemistry.

In another aspect, the present invention relates to a method of treating one or more wafers. At least one wafer is provided that includes first and second opposed major faces. At least one feature including a metal silicide is included on the first major face. An acidic chemistry comprising at least one of sulfuric acid and phosphoric acid is caused to contact the first major face of the wafer. After the acidic chemistry is caused to contact the first major face of the wafer, an inert rinsing fluid is dispensed onto the first major face. The wafer spins during at least a portion of the time that the inert rinsing fluid contacts the first major face of wafer. A neutralizing liquid is dispensed onto the second major face of the wafer. During at least a portion of the time that the inert rinsing fluid contacts the first major face of the spinning wafer, the neutralizing liquid contacts the second major face of the spinning wafer. Desirably, direct contact between the first major face and the neutralizing liquid is substantially avoided to help minimize exposure of the metal silicide feature to the neutralizing chemistry.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

According to one preferred mode of practice, one or more microelectronic device precursors are provided. Each precursor generally incorporates microelectronic device features or precursors thereof supported on a suitable substrate, such as a semiconductor wafer. Exemplary semiconductor wafers may include one or more semiconductor materials such as silicon, germanium, silicon carbide, silicon germanium, germanium arsenide, germanium nitride, germanium antimonide, germanium phosphide, aluminum arsenide, aluminum nitride, aluminum antiminide, aluminum phosphide, boron arsenide, boron nitride, boron phosphide, indium arsenide, indium nitride, indium antimonide, indium phosphide, aluminum gallium arsenide, indium gallium arsenide, indium gallium phosphide, aluminum indium arsenide, aluminum indium antimonide, copper oxide, copper indium gallium, copper indium gallium selenide, copper indium gallium sulfide, copper indium gallium sulfide selenide, Aluminium gallium indium phosphide, Aluminium gallium arsenide phosphide, Indium gallium arsenide phosphide, Indium gallium arsenide antimonide, Indium arsenide antimonide phosphide, Indium arsenide antimonide phosphide, Aluminium indium arsenide phosphide, Aluminium gallium arsenide nitride, Indium gallium arsenide nitride, Indium aluminium arsenide nitride, gallium arsenide, Gallium arsenide antimonide nitride, Gallium indium nitride arsenide antimonide, Gallium indium arsenide antimonide phosphide, Cadmium selenide, Cadmium sulfide, Cadmium telluride, Zinc oxide, Zinc selenide, Zinc sulfide, Zinc telluride, Cadmium zinc telluride, Mercury cadmium telluride, Mercury zinc telluride, Mercury zinc selenide, Cuprous chloride, Copper sulfide, Lead selenide, Lead(II) sulfide, Lead telluride, Tin sulfide, Tin sulfide, Tin telluride, Lead tin telluride, Thallium tin telluride, Thallium germanium telluride, Bismuth telluride, Cadmium phosphide, Cadmium arsenide, Cadmium antimonide, Zinc phosphide, Zinc arsenide, Zinc antimonide, Titanium dioxide, anatase, Titanium dioxide, rutile, Titanium dioxide, Copper (I) oxide, Copper(II) oxide, Uranium dioxide, Uranium trioxide, Bismuth trioxide, Tin dioxide, Barium titanate, Strontium titanate, Lithium niobate, Lanthanum copper oxide, combinations of these, and the like.

The first major face (often referred to as the front side) of the workpiece desirably incorporates at least one feature that incorporates one or more materials for which the neutralizing liquid to be used is etching rather than non-etching. Factors impacting whether a material is etched by the neutralizing liquid include the concentration of ingredients included in the neutralizing liquid, the nature of the material, temperature, and the like. Thus, a material may be sensitive to a neutralizing liquid having a relatively concentrated formulation but may not be etched by more dilute formulations. Some neutralizing liquids may etch some materials to a relatively large degree, but may be substantially non-etching as to other materials.

By way of example, illustrative neutralizing solutions include aqueous ammonia, aqueous solutions comprising ammonia and hydrogen peroxide, choline, TMAH (tetra methyl ammonium hydroxide), TEAH (tetraethylammonium hydroxide), combinations of these, and the like. One useful neutralizing liquid (hereinafter referred to as the SC1 Chemistry) is formulated from 1 part by volume of aqueous ammonium hydroxide (29 weight percent ammonium hydroxide), 4 parts by volume of aqueous hydrogen peroxide (30 weight percent peroxide), and 70 parts by volume water. The SC1 chemistries in general are used for general cleaning, particle removal, and acid neutralizing. An SC1 chemistry with this concentration of aqueous ammonium hydroxide can cause more than about 0.1 angstroms, even more than about 0.3 angstroms, and even more than about 0.5 angstroms of etching per the non-etching test protocol described herein with respect to materials such as one or more silicides, oxides, nitrides, silicon, metals, combinations of these, and the like. In preferred embodiments, sensitive features include silicides of nickel and/or platinum. Note that any of the chemistries listed in this paragraph also could be non-etching according to the non-etching test protocol with respect to some materials if sufficiently dilute.

In a typical mode of practice, the precursor workpiece(s) as provided are treated with an acid chemistry. Acid processing can be used for a variety of reasons. As one reason, the acid chemistry can be used to remove photoresist or residues thereof from workpiece surfaces. Acid chemistries also may be used to etch TiN, Ti, W, Ni, NiPt alloy, cobalt, CoNi alloys, other metals or combinations of metals, and/or the like.

A wide variety of different acid chemistries may be used to treat precursor workpieces in the practice of the present invention. Exemplary acid chemistries for removing photoresist or metal are aqueous solutions including one or more of sulfuric acid, phosphoric acid, and/or ingredients that are converted into such acids in situ. One useful acid chemistry is formulated from about 1 to about 100 parts by volume of concentrated sulfuric acid (96 weight percent sulfuric acid), per about 1 part by volume of aqueous hydrogen peroxide (30 weight percent peroxide). A chemistry formulated from sulfuric acid and hydrogen peroxide is referred to in the industry as the SPM chemistry and/or the Piranha chemistry. Another exemplary acid chemistry is formulated from about 0.5 to about 2 parts by volume of concentrated sulfuric acid (96 weight sulfuric acid) per about 1 part of by volume of aqueous phosphoric acid (85 weight percent phosphoric acid).

The acidic chemistry is caused to contact the first major surface of the workpiece(s) being processed under conditions effective to remove at least a portion of the photoresist that may be present on the surface. In a typical treatment, the acidic chemistry may be applied to the first major surface in a variety of ways including spraying onto all or a portion of a chord of the wafer, pouring chemistry onto a central region of the wafer, combinations of these, or the like. Often, the workpiece spins during the treatment at a suitable rpm. Exemplary spin rates may be in the range from about 10 rpm to about 1000 rpm, often about 25 rpm to about 500 rpm, or even about 50 rpm to about 300 rpm.

The acidic chemistry may be provided at one or more suitable temperatures. Suitable temperatures may be below ambient temperature, at ambient temperature, or above ambient temperature. In one mode of practice, an SPM chemistry is provided at a temperature of about 150° C.

The acid chemistry is supplied at a suitable flow rate effective to provide the desired action within a reasonable time period. If the flow rate is too low, the process may take longer than desired to complete. If the flow rate is too high, too much reagent may be used to accomplish the same performance as might be achieved using a lower flow rate. Balancing such concerns, an acid reagent may be supplied at a flow rate in the range from about 200 ml/min to about 2000 ml/min, preferably about 800 ml/min to about 1500 ml/min per workpiece for a time period ranging from about 10 seconds to about 180 seconds, preferably about 15 seconds to about 60 seconds.

In an exemplary mode of practice for carrying out an acid treatment, an aqueous acid is dispensed onto the first major surface of a workpiece for about 5 seconds while the workpiece spins at about 200 rpm. The acid is formulated by combining about 1.2 liters/min of concentrated aqueous sulfuric acid (96 weight percent). After about 5 seconds, the flow of sulfuric is dropped to about 0.6 l/min and aqueous hydrogen peroxide is co-introduced with the sulfuric acid onto the first major surface for an additional about 45 seconds. This accomplished by co-introducing about 0.6 liters/min of aqueous hydrogen peroxide (30%) with the aqueous acid flow. Delaying the introduction of peroxide in this manner helps to provide more stable flow control and better mixing.

After the acid treatment, an optional transition step may be practiced as a transition between the acid treatment step and one or more subsequent rinsing/neutralization treatments. For example, after an acid treatment using the SPM chemistry, it may be desirable to treat the first major surface and optionally the second major surface (often referred to as the back side) of the wafer one or more times with one or more oxidizing reagents in order to help improve the efficacy of the subsequent rinsing/neutralizing step. Exemplary oxidizing reagents include aqueous peroxide solution, ozone gas, a mixture of steam and ozone, and/or ozonated water.

In an illustrative mode of practice, a suitable oxidizing reagent is an aqueous solution obtained by formulating from about 1 part by volume of aqueous hydrogen peroxide (30 weight percent peroxide) and 0 to about 10 parts by volume of water. The oxidizing reagent may be provided at one or more suitable temperatures. Suitable temperatures may be below ambient temperature, at ambient temperature, or above ambient temperature. In one mode of practice, the oxidizing reagent is provided at ambient temperature.

The workpiece may spin at any suitable spin rate(s) during the course of the treatment with the oxidizing reagent(s). The spin rates discussed above with respect to the acid treatment would be suitable.

An oxidizing reagent is supplied at a suitable flow rate effective to provide the desired action within a reasonable time period. If the flow rate is too low, the process may take longer than desired to complete. If the flow rate is too high, too much reagent may be used to accomplish the same performance as might be achieved using a lower flow rate. Balancing such concerns, an oxidizing reagent may be supplied at a flow rate in the range from about 30 ml/min to about 1500 ml/min, preferably about 85 ml/min to about 500 ml/min for a time period ranging from about 5 seconds to about 30 seconds, preferably 10 seconds to about 20 seconds.

If the transition treatment with an oxidizing reagent is performed in two or more cycles, the workpiece desirably may be rinsed with deionized water between the oxidizing treatments. The oxidizing reagent may be the same or different in each such cycle.

For example, in one mode of practice, an acid treatment is followed by treating at least the first major surface of a workpiece with aqueous hydrogen peroxide formulated using flow rates that combine 1 part by volume of 30% hydrogen peroxide and 3 parts by volume of water. Desirably, this reagent is used to treat both the first major surface, i.e., the front side, and the second major surface, i.e., the back side of the workpiece for about 15 seconds at ambient temperature by dispensing 1.3 liters/min on the first major surface and 1 liter/min on the second major surface while the workpiece spins at 300 rpm. Next, the first and second major surfaces are rinsed with cold, deionized water for about 5 seconds by dispensing about 1.5 liters/min onto the first face and about 1 liter/min onto the second face while the workpiece continues to spin at 300 rpm. This rinse is followed by a second cycle of treatment with an oxidizing reagent. The second oxidizing reagent is aqueous hydrogen peroxide formulated using flow rates that combine 1 part by volume of 30% hydrogen peroxide and 2 parts by volume of water. Desirably, this reagent is used to treat at least the first major surface of the workpiece for about 7 seconds at ambient temperature by dispensing 2 liters/min on the first major surface while the workpiece spins at 300 rpm. Optionally, the reagent can be used to treat both major surfaces at the same time if the tool being used has capabilities that allow this.

The oxidizing transition treatment desirably is followed by rinsing the first major surface with a non-etching rinsing liquid. For example, this may involve rinsing with cold deionized water for about 3 seconds at a flow rate of 2 liters/min while the wafer continues to spin at 300 rpm. This rinsing step functions both as the end of the transition treatment with the oxidizing reagent and the beginning of the rinsing/neutralizing step. After the three second delay, a neutralizing chemistry is then dispensed onto another surface of the process chamber, such as the second major surface of the spinning workpiece, while the non-etching rinsing liquid continues to be dispensed onto the first major surface.

In an exemplary mode of practice, the neutralizing chemistry is dispensed onto the second major surface and the deionized rinse water is dispensed onto the first major surface for a suitable period effective to accomplish the desired level of rinsing and neutralization. In many embodiments, this co-dispensing occurs for a period in the range from about 3 seconds to about 300 seconds. In one embodiment, a period of 30 seconds would be suitable.

A preferred neutralizing chemistry includes aqueous ammonia and aqueous hydrogen peroxide. Exemplary embodiments of this neutralizing chemistry may be obtained from flow rates that combine from about 1 to about 40 parts by volume of aqueous ammonia (29 weight percent ammonium hydroxide), about 1 to about 40 parts by volume of aqueous hydrogen peroxide (30 weight percent peroxide), and about 200 parts by volume of water. In a preferred embodiment, a neutralizing chemistry is obtained from flow rates that combine 1 part by volume of aqueous ammonia (29 weight percent ammonium hydroxide), 5 parts by volume of aqueous hydrogen peroxide (30 weight percent peroxide), and 70 parts by volume water.

The neutralizing chemistry may be dispensed at a flow rate within a wide range. Exemplary flow rates per wafer are in the range from about 0.3 liters/min to about 20 liters/min, preferably from about 0.4 liters/min to about 5 liters/min, more preferably about 0.5 liters/min to about 3 liters/min. In one mode of practice, a flow rate of about 1.25 liters/min would be suitable.

The rinsing/neutralizing step can end in a variety of ways. In a preferred mode of practice, the rinsing/neutralizing step ends with a transition to a subsequent rinsing step in which both the first and second major surfaces are rinsed with a non-etching rinsing liquid such as deionized water. This can be accomplished by simply stopping the flow of neutralizing chemistry onto the second major surface while a flow of the non-etching rinsing fluid continues to be dispensed onto the first major surface. At this point, the rinsing/neutralizing step is completed, and a subsequent rinsing step is started.

In one mode of practice the flow of the neutralizing chemistry is stopped while 2 liters/min of deionized water continues to be dispensed onto the first major surface for a suitable time period such as 5 seconds. After this period, a non-etching rinse liquid can be co-dispensed onto both the first and second major surfaces for a suitable time period. For example, 1.3 liters per minute of cold deionized water and 1 liter per minute of cold deionized water can be co-dispensed on the first and second major surfaces, respectively while the workpiece continues to spin at 300 rpm.

At this stage, acid and acid byproducts are effectively and thoroughly rinsed and removed from the workpiece and process chamber surfaces. The workpiece can be further rinsed (if desired) and then dried or otherwise handled for subsequent processing.

Desirably, any one or more of the process steps described herein are carried out in an inert, protective atmosphere. Exemplary inert atmospheres include nitrogen, argon, carbon dioxide, clean dry air, combinations of these, and the like.

The present invention will now be further described with reference to the following illustrative examples.

Example 1

Comparative

In this example, a wafer is treated using the versatile ORION® tool available from FSI International, Inc., Chaska, Minn. The wafer has a bare silicon surface with native oxide.

In this example, the sulfuric acid reagent is a concentrated, aqueous solution containing 96% by weight acid in water unless otherwise expressly noted. The peroxide is an aqueous solution containing 30% by weight peroxide in water unless otherwise expressly noted. For Example 2, the ammonium hydroxide is an aqueous solution containing 29% by weight ammonium hydroxide in water unless otherwise expressly noted.

All steps described in this Example occur under a blanket of nitrogen flowing at 300 slpm unless otherwise expressly noted.

1.2 lpm (liters per minute) of 160° C. concentrated sulfuric acid is dispensed through the center chemical nozzle of the ORION® tool onto a spinning wafer (200 rpm) for five seconds. This preheats the wafer and uniformly covers the wafer with acid. Next, a mixture of 0.6 lpm of $H_2O_2$ and 0.6 lpm of the concentrated sulfuric acid are dispensed onto the wafer (200 rpm) through the spray bar. This occurs for 45 seconds.

After the acid and peroxide dispense is complete, 800 ml/min of peroxide solution at room temperature is dispensed onto the wafer (300 rpm) for 15 s through the center chemical nozzle to begin the process of rinsing off the sulfuric acid. Following this rinse, 1.3 lpm of an 80° C. 1:3 (by volume) $H_2O_2/H_2O$ blend is dispensed to the top of the wafer (300 rpm) for 15 s through the center chemical nozzle, while 1 lpm of the same blend is dispensed to the back side of the wafer through a separate nozzle. This step further rinses the front side and back side of the wafer with the blend.

Next, the wafer front side (300 rpm) is rinsed with 2.3 lpm of DI (deionized) water at room temperature through the DI water center nozzle for 5 s to remove acid residue that may have contaminated this nozzle during the sulfuric acid dispense step. Following this step, the wafer (300 rpm) is rinsed for 7 seconds with 2 lpm, 50° C. 1:2 (by volume) $H_2O_2/H_2O$ blend through the spray bar, to rinse sulfuric acid out of the spray bar. Then, the wafer front side (300 rpm) is rinsed with 2 lpm of DI water at room temperature for 3 s using an alternate plumbing path to rinse this alternate path.

An intermediate wafer rinse is accomplished by rinsing the front side of the wafer (200 rpm) through the front side DI rinse nozzle with 1.3 lpm of DI water at room temperature for 60 s, while at the same time 1.25 lpm of DI water is dispensed to the back side of the wafer.

Following the intermediate wafer rinse, the wafer (300 rpm) is rinsed with 2 lpm of DI water at room temperature through the spray bar for 5 s. The front side of the wafer is then rinsed with 1.3 lpm of DI water at room temperature through the center chemical nozzle, while the wafer chuck is rinsed with 1 lpm of DI water at room temperature for 5 s. Next the front side of the wafer (300 rpm) is rinsed with 1.3 lpm of DI water at room temperature through the center chemical nozzle, while the back side of the wafer is rinsed with 1 lpm of DI water at room temperature for 15 s. These steps are designed to rinse the various plumbing paths following a chemical dispense such as that for a metal etching process.

The wafer is then rinsed with 0.75 lpm of DI water at room temperature through the center top rinse nozzle for a final wafer rinse. For this rinse, the initial wafer spin speed is 300 rpm for 3 seconds. Then the spin speed is increased at a rate of 100 rpm per second to 1000 rpm. The spin speed is held at 1000 rpm for about 3 seconds. Then, the spin speed is ramped back down to 300 rpm at a rate of 100 rpm's and held at 300 rpm for 3 seconds. After the rinse, the wafer is spun dry by ramping the spin speed up to 1000 rpm at a rate of 100 rpm/s and held at 1000 for 20 seconds. The spin speed is ramped down to 0 rpm at a rate of 1000 rpm/s. The spin drying step occurs at room temperature under a flow of nitrogen at 450 slpm.

At no point during the recipe was any SC1 chemistry (a mixture of ammonium hydroxide, hydrogen peroxide and water) used on any of the wafers. Before processing, the bare silicon wafers are measured for surface particle contamination using a KLA SP2 system calibrated to count the number of particles on the surface larger than 45 nm, nominal diameter. The wafers are re-measured in the same manner immediately after processing and then again after 12 hours of storage in a FOUP (front-opening unified pod) carrier box.

The final particle counts for the wafers after storage in the FOUP are as follows. The starting particle count typically is less than about 500:

| Wafer No. | Final number of particles |
| --- | --- |
| 1 | 228697 |
| 2 | 162769 |
| 3 | 221895 |
| 4 | 227744 |
| 5 | 230026 |

The number of particles may actually be higher than what was reported in this table, as several of these wafers closely approached the maximum number of particles that the measurement tool can count.

Example 2

In this example, wafers are processed according to Example 1, except instead of the 60 s intermediate rinse, the front side of the wafer (200 rpm) is rinsed through the front side DI rinse nozzle with 1.3 lpm of DI water at room temperature for 60 s, while at the same time 1.25 lpm of the SC1 Chemistry (1:4:70 parts by volume of 29% by weight aqueous ammonium hydroxide, 30% by weight aqueous hydrogen peroxide, and water, respectively) at room temperature is dispensed onto the back side of the wafer. The SC1 Chemistry rinses acid from the back side of the wafer and from the mechanical parts of the chamber below the wafer surface, while the front side of the wafer is protected from the SC1 Chemistry with the DI water rinse.

The particles that were added to these wafers after sitting over night are shown in the following table. The data show that the principles of the present example reduces added particles by 3 to 4 orders of magnitude relative to the data shown in Example 1.

| Wafer No. | Number of added particles |
|---|---|
| 6 | 197 |
| 7 | 94 |
| 8 | 40 |

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims

What is claimed is:

1. A method of treating one or more wafers, comprising the steps of:
    a) providing at least one wafer in a process chamber, wherein said wafer includes first and second opposed major faces and at least one feature sensitive to a neutralizing chemistry included on the first major face, and wherein said process chamber includes process chamber surfaces that are on, above and below the wafer;
    b) causing an acidic chemistry to contact the first major face of the wafer while the wafer is spinning, wherein said contact with the acid chemistry causes acid and acid by-product material to be present on the wafer and on other process chamber surfaces;
    c) after causing the acidic chemistry to contact the first major surface of the wafer, treating the first and second major surfaces of the wafer with one or more oxidizing reagents;
    d) after step (c), causing a non-etching rinsing fluid to contact the first major face while the wafer is spinning; and
    e) after step (d), causing a non-etching rinsing fluid to contact the first major face of the spinning wafer to rinse the first major surface and other process chamber surfaces such that acid and acid by-product material from the first major surface and other chamber surfaces above the wafer are transported to lower process chamber surfaces, and during at least a portion of the time that the non-etching rinsing fluid is caused to contact the first major face of the spinning wafer, co-dispensing and causing a neutralizing liquid to contact the second major face of the spinning wafer in a manner such that the neutralizing liquid sheets outward and rinses the second major surface of the wafer and is slung off the second major surface to neutralize and rinse off process chamber surfaces at and below the wafer while the non-etching rinsing fluid on the first major surface protects the first major surface against contact with the neutralizing liquid.

2. The method of claim 1, wherein direct contact between the first major face of the wafer and the neutralizing liquid is substantially avoided during step (e).

3. The method of claim 1, wherein the oxidizing agent treatment is performed in two or more steps.

4. The method of claim 3, wherein the first major face of the wafer is rinsed with a non-etching rinsing liquid between each treatment with the oxidizing agent.

5. The method of claim 1, wherein one or more of the steps are carried out in an inert atmosphere.

6. The method of claim 1, wherein the neutralizing liquid comprises at least one of (i) aqueous ammonia, or (ii) aqueous solutions comprising ammonia and hydrogen peroxide, choline, tetra methyl ammonium hydroxide, and combinations thereof.

7. The method of claim 6, wherein the neutralizing liquid comprises 1 part by volume aqueous ammonium hydroxide, 4 parts by volume aqueous hydrogen peroxide, and 70 parts by volume water.

8. The method of claim 1, wherein the acidic chemistry comprises at least one of sulfuric acid, phosphoric acid, and/or ingredients that are converted into such acids in situ, and combinations thereof.

9. The method of claim 8, wherein the acidic chemistry is selected from (a) from about 1 to about 100 parts by volume of concentrated sulfuric acid (96 weight percent sulfuric acid), per about 1 part by volume of aqueous hydrogen peroxide (30 weight percent peroxide), and (b) from about 0.5 to about 2 parts by volume of concentrated sulfuric acid (96 weight sulfuric acid) per about 1 part of by volume of aqueous phosphoric acid (85 weight percent phosphoric acid).

10. The method of claim 1, wherein the wafer is spun at a rate of from 10 to 1000 rpm during step (b).

11. The method of claim 1, wherein the acidic chemistry is applied at a flow rate of from about 200 ml/min to about 2000 ml/min.

12. The method of claim 1, wherein the non-etching rinsing fluid is deionized water.

13. The method of claim 1, wherein the neutralizing liquid is dispensed at a flow rate in the range from about 0.3 liters/min to about 20 liters/min.

14. The method of claim 1, wherein the neutralizing liquid is an aqueous solution comprising ammonia and hydrogen peroxide.

15. The method of claim 1, wherein the acid chemistry comprises sulfuric acid and/or ingredients that are converted into sulfuric acid in situ.

* * * * *